United States Patent
De Langen (10) Patent No.: US 7,245,165 B2
(45) Date of Patent: Jul. 17, 2007

(54) TURN-ON BUS TRANSMITTER WITH CONTROLLED SLEW RATE

(75) Inventor: Klaas-Jan De Langen, Sunnyvale, CA (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/535,556

(22) PCT Filed: Nov. 14, 2003

(86) PCT No.: PCT/IB03/05166

§ 371 (c)(1),
(2), (4) Date: May 18, 2005

(87) PCT Pub. No.: WO2004/047294

PCT Pub. Date: Jun. 3, 2004

(65) Prior Publication Data

US 2006/0012411 A1    Jan. 19, 2006

(51) Int. Cl.
*H03K 5/12* (2006.01)
(52) U.S. Cl. .................. 327/170; 327/108; 326/83
(58) Field of Classification Search ............ 327/374, 327/379, 387, 108, 109, 384, 389, 170; 326/83
See application file for complete search history.

(56) References Cited

U.S. PATENT DOCUMENTS

| 4,320,521 | A | 3/1982 | Balakrishnan et al. |
| 4,593,206 | A | 6/1986 | Neidorff et al. |
| 4,825,099 | A | 4/1989 | Barton |
| 5,070,256 | A | 12/1991 | Grondalski |
| 5,583,465 | A | 12/1996 | Fonderie et al. |
| 6,100,742 | A * | 8/2000 | Erckert ............ 327/374 |
| 6,281,730 | B1 | 8/2001 | Vu |

FOREIGN PATENT DOCUMENTS

EP    0 575 676    12/1993

* cited by examiner

*Primary Examiner*—Dinh T Le (57) ABSTRACT

An amplifier/driver (40) for a bus has an output transistor (M1) that is controlled by a controlled current source (I1). In a quiescent state, the output transistor is configured as part of a current mirror (M1, M11) that maintains a gate-source voltage on the output transistor above the threshold voltage of the output transistor, thereby providing a fast turnon turn-on time. In an active state, the controlled current source provides a substantially constant current to the output transistor to achieve a controlled slew-rate, then reduces the current to the output transistor when a desired output voltage level is achieved. To improve power efficiency, a second controlled current source (I2) provides current to the output load when the desired output voltage level is achieved. To minimize transients, a class-AB control circuit (710) provides a minimum bias current to the output transistor, to prevent it from turning off when the desired output voltage level is achieved.

15 Claims, 11 Drawing Sheets

TURN-ON BUS TRANSMITTER WITH CONTROLLED SLEW RATE

This invention relates to the field of electronic circuits, and in particular to an amplifier/driver with fast turn-on time and controlled slew rate.

Figure 1A:
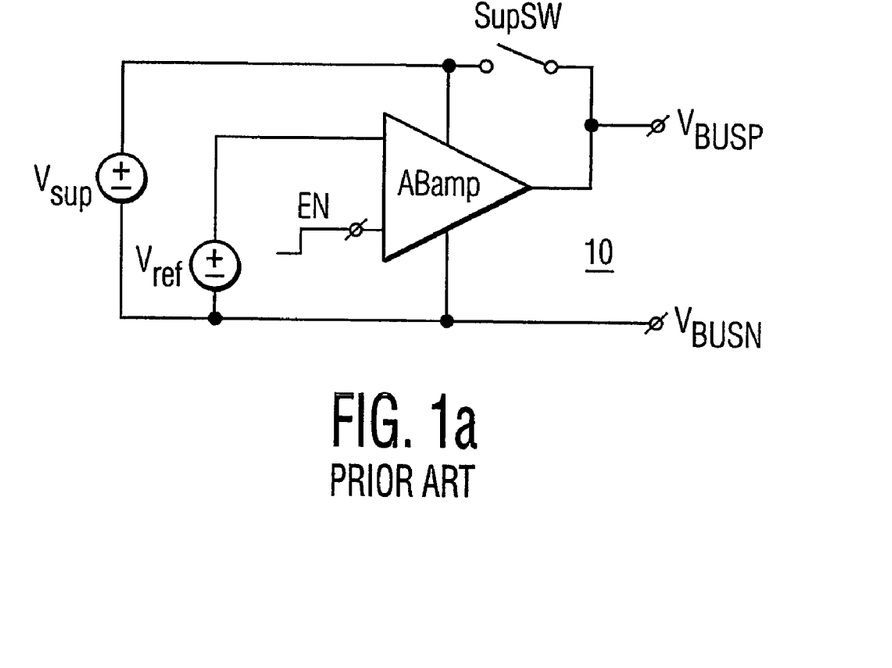
FIGS. 1a, 1b illustrate an example prior art class-AB bus driver/amplifier and its associated output waveform.
Figure 1B:
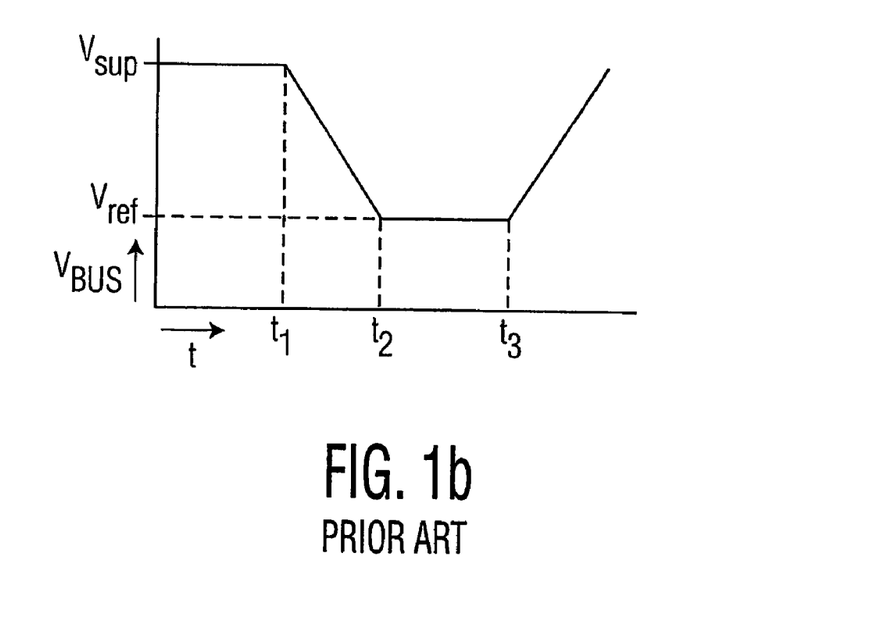

FIGS. 1a-1b illustrate a conventional bus driver 10 that is configured to transmit power as well as data across a two-wire bus. FIG. 1a shows the schematic of the transmitter and FIG. 1b displays the shape of the bus signal. Initially, the supply switch SupSW is closed and the amplifier ABamp is disabled by keeping the digital input signal EN low. Thus, the bus voltage Vbusp is connected to the power supply Vsup so that power can be transferred to the devices connected to the bus. At time t1 the supply switch SupSW is opened and the amplifier is enabled by switching the digital input EN high. Then, the amplifier starts pulling the bus voltage down with a controlled slew rate. Because of the controlled slew rate, the high frequency content of the bus signal is reduced yielding low electromagnetic emission (EME). At time t2 the required value of the bus voltage for the data level is reached and the amplifier stops slewing and keeps the bus voltage constant. The value of the data level is controlled by amplifier input Vref. By changing the input voltage Vref different data levels can be created corresponding to a digital '0' or '1'. By increasing the number of levels, more data bits or different types of information can be transferred. At time t3 the amplifier is disabled and the switch SupSW is turned on. The bus voltage rises with a slew-rate that is controlled by the switch and its driving circuit until the supply voltage Vsup is reached and a new cycle can start. For power efficiency the amplifier ABamp is preferably biased in class AB.

Figure 2A:
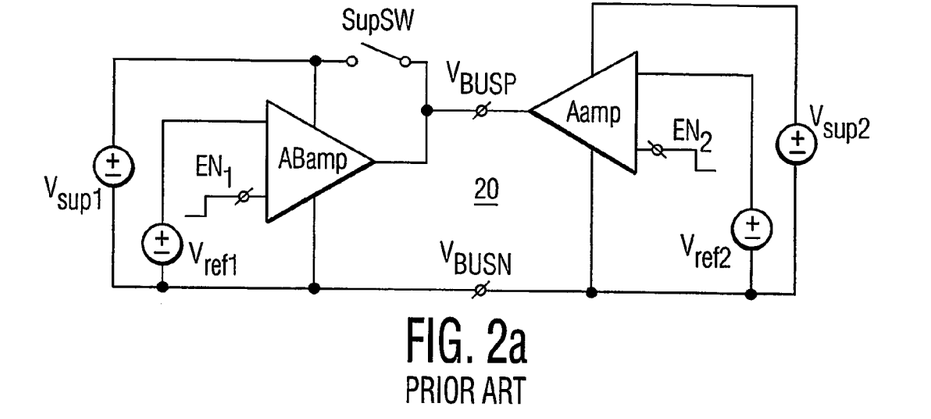
FIGS. 2a, 2b illustrate an example bus that is driven by a class-AB bus driver/amplifier and a class-A bus driver/amplifier, and the associated waveform on the bus when driven by each.
Figure 2B:
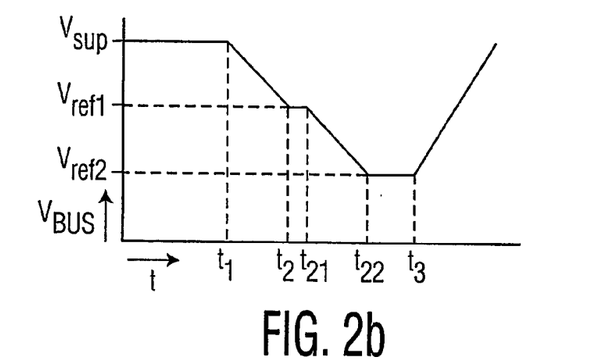

FIG. 2a illustrates a conventional configuration of a bus with two drivers/amplifiers ABamp and Aamp, and FIG. 2b illustrates the shape of the bus signal Vbusp. The amplifier ABamp has a current limit, and thus the second amplifier Aamp can pull the bus down to a second level Vref2 as shown in FIG. 2b. In this way, common bus systems with two or more drivers/transmitters can be created. The shape of the bus voltage as depicted in FIG. 2b is identical to the waveform shown in FIG. 1b until the first reference voltage Vref1 is reached at time t2. By switching digital input EN2 on, the second amplifier Aamp starts to slew the bus voltage down to a second level determined by input voltage Vref2 at time t21. At time t22 the second bus level is reached and at time t3 the bus voltage starts to slew back to the supply voltage by closing switch SupSW and disabling all amplifiers. Because the second amplifier Aamp is biased by the first amplifier ABamp, it can be implemented as a simpler class-A circuit.

U.S. Pat. No. 4,320,521, issued 16 Mar. 1982 to Balalcrisnan et al., U.S. Pat. No. 4,593,206, issued 3 Jun. 1986 to Neidorff et al., and U.S. Pat. No. 5,070,256, issued 3 Dec. 1991 to Grondalski, disclose bus drivers with controlled slew rate, using the principles illustrated in FIG. 3, and are incorporated by reference herein.

Figure 3:
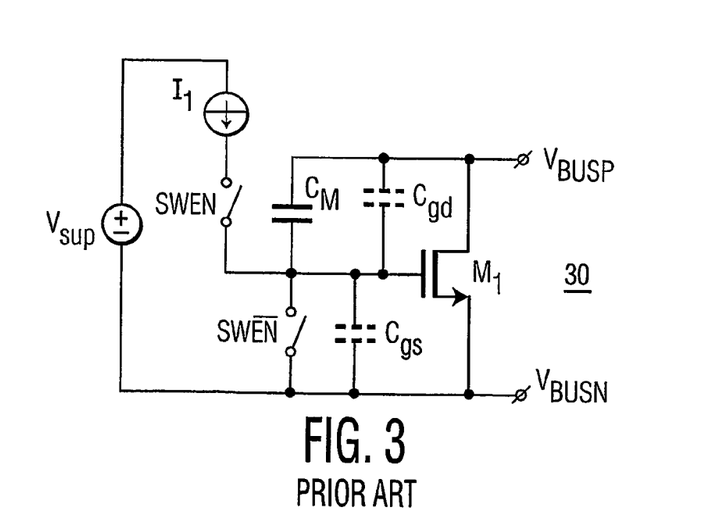
FIG. 3 illustrates an example prior-art controlled slew-rate driver/amplifier.

The prior art circuit 30 of FIG. 3 consists of amplifier stage M1 with Miller capacitor CM and a current-limited input drive I1. When switch SWEN is closed and switch SW EN is opened the output transistor M1 is turned on, pulling the output voltage Vbusp down. Because of the feedback around M1, the current I1 is mainly flowing through the Miller capacitor CM and the parasitic gate-drain capacitance Cgd of M1. Assuming the voltage at the gate is almost constant, the change in capacitor voltage directly results in a change in output voltage given by:

$$\frac{dVout}{dt} = \frac{I_1}{C_M + C_{gd}} \quad (1)$$

That is, the output voltage is slewing down at a constant rate determined by the current I1 and the value of capacitors CM and Cgd. When SWEN is opened, and SWEN is closed, transistor M1 is turned off and another circuit can pull the bus voltage high.

As is known in the art, a limitation of the driver as presented in FIG. 3 is that it can only be used to pull the bus voltage all the way down to Vbusn, so that other bus levels are not possible. A second problem is that the turn-on time is slow. When the output stage is turned on, the gate-source voltage of M1 is small, and must be increased beyond its threshold voltage before a reasonable amount of drain current is flowing and the output voltage really starts dropping. Therefore, initially all the driving current I1 is used to charge the gate-source capacitance Cgs resulting in a long turn-on delay.

It is an object of this disclosure to present a bus driving circuit having a fast turn-on time. It is a further object of this disclosure to present a bus driving circuit that facilitates maintaining intermediate non-zero voltages on the bus.

These objects and others are achieved by an amplifier/driver having an output transistor that is controlled by a controlled current source. In a quiescent state, the output transistor is configured as part of a current mirror that maintains a gate-source voltage on the output transistor above the threshold voltage of the output transistor, thereby providing a fast turn-on turn-on time. In an active state, the controlled current source provides a substantially constant current to the output transistor to achieve a controlled slew-rate, then reduces the current to the output transistor when a desired output voltage level is achieved. To improve power efficiency, a second controlled current source provides current to the output load when the desired output voltage level is achieved. To minimize transients, a class-AB control circuit provides a minimum bias current to the output transistor, to prevent it from turning off when the desired output voltage level is achieved.

In a preferred embodiment, the bus driver comprises a first current source, an output transistor, a mirror transistor, and a switch that is configured to selectively couple the mirror transistor and the output transistor to form a first current mirror that controls bias current through the output transistor.

More specifically, the driver comprises a first current source; an output transistor having a gate operably coupled to the first current source, a drain operably coupled to a first node of the bus, and a source operably coupled to a second node of the bus; a mirror transistor having a gate operably coupled to the gate of the output transistor, a drain operably coupled to the gate of the output transistor, and a source; a switch operably coupled between the source of the mirror transistor and the second node of the bus; and a Miller capacitor coupled between the drain of the output transistor and the gate of the output transistor.

Figure 4:
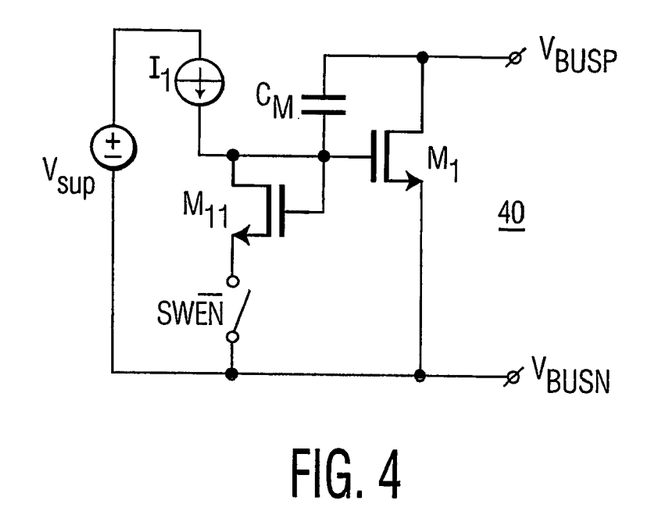
FIG. 4 illustrates an example controlled slew-rate driver/amplifier with fast turn-on time.

FIG. 4 illustrates an example controlled slew-rate driver/amplifier 40 with fast turn-on time. In this circuit 40, current I1 is always flowing into the node at the gate of M1. When the output stage is disabled by closing switch $\overline{SWEN}$, the current I1 is flowing into diode-connected transistor M11. The combination of transistor M11 and output stage M1 is now operating as a current mirror and the output stage is prebiased at a drain current determined by I1 and the width-to-length (W/L) ratios of M1 and M11. As a result, the gate-source voltage of M1 is prebiased at a voltage level that is higher than its threshold voltage. When the output stage is turned on by opening switch $\overline{SWEN}$, the gate-source voltage of M1 only needs to be increased by a small amount to fully turn on, thereby achieving a fast turn-on time.

Figure 5:
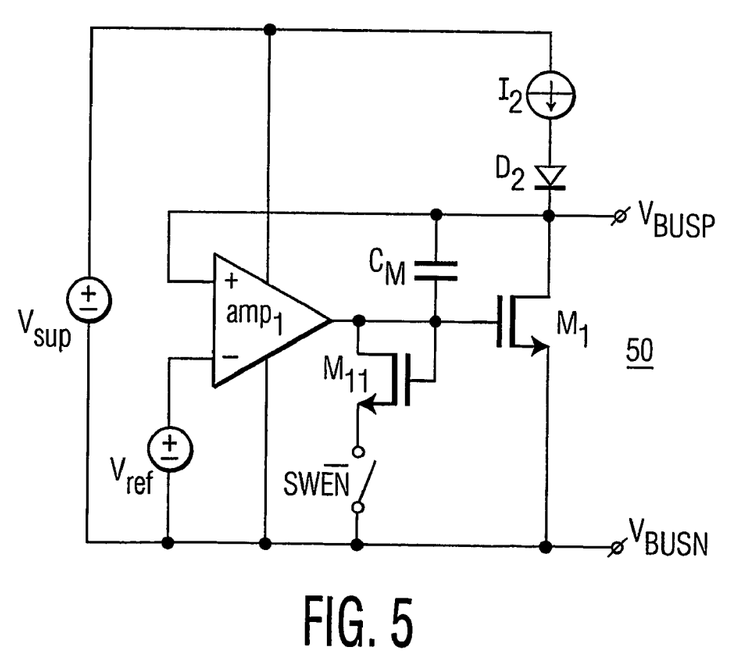
FIG. 5 illustrates an example controlled slew-rate driver/amplifier with fast turn-on time and controllable output voltage level.

FIG. 5 illustrates an example controlled slew-rate driver/amplifier 50 with fast turn-on time and controllable output voltage level. This is achieved by replacing the constant driver current I1 of FIG. 4 with a controlled current source, amplifier amp1. The amplifier amp1 compares the output voltage at node Vbusp to the reference voltage Vref. As long as the output voltage Vbusp is larger than the reference voltage Vref, the gate of M1 is driven. The amplifier amp1 is configured so that its output is current limited, thereby controlling the output voltage Vbusp to slew down at a constant rate. When the output voltage Vbusp decreases to the reference voltage Vref, amplifier amp1 reduces the current to the gate of M1 until the output voltage Vbusp is stable and equal to Vref. Thus amplifier amp1 sets up a feedback loop together with output stage M1 that controls the output voltage at the bus node Vbusp. Current source I2 biases M1 and allows a load on the bus (not shown) to draw some current from the bus. When the bus driver 50 is disabled by closing switch $\overline{SWEN}$, blocking diode D2 allows bus voltages Vbusp that are larger than the supply voltage Vsup of the bus driver. Since the bias current I2 is continuously flowing, the bus driver 50 is biased in class A.

Figure 6:
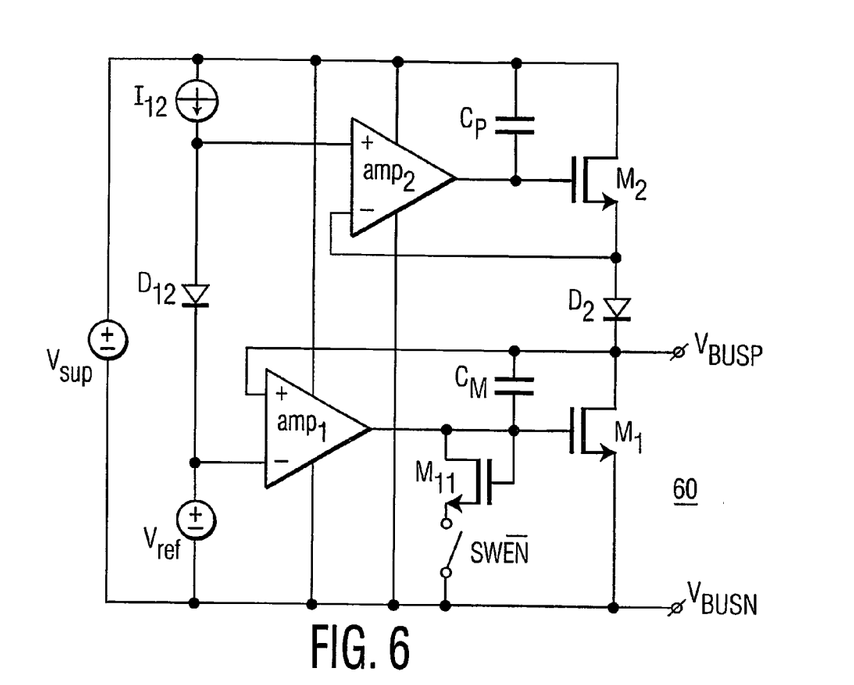
FIG. 6 illustrates an example controlled slew-rate class-AB driver/amplifier with fast turn-on time and controllable output voltage level.

FIG. 6 illustrates an example controlled slew-rate class-AB driver/amplifier 60 with fast turn-on time and controllable output voltage level. Class-AB operation provides improved power efficiency, and is achieved by replacing current source I2 of FIG. 5 with transistor M2, and controlling M2 via a second feedback loop created by amplifier amp2. Transistor M2 provides the current to the load (not shown) at Vbusp when the output voltage Vbusp equals the reference voltage Vref. Diode D12, which is biased by current source I12, compensates for the voltage drop across D2 when diode D2 is conducting. Capacitor Cp stabilizes this second feedback loop.

The operation of this circuit 60 is best illustrated with regard to the different operating regions defined in FIG. 1a.

In the first region before t1, switch $\overline{SWEN}$ is closed and M1 is biased at a quiescent current defined by the maximum output current of amplifier amp1 and the W/L ratios of M11 and M1, as discussed above with regard to FIG. 4. Diode D2 is blocking and therefore transistor M2 is not biased.

In the second region between t1 and t2, switch SWEN is open and M1 is driven hard. Diode D2 is still blocking so that M2 is again not biased.

In region three, between t2 and t3, diode D2 is conducting and, when the load is not drawing current, transistors M1 and M2 are biased at a quiescent current determined by D2 and D12. In this case the feedback loops control the output transistors M1 and M2 so that the voltage between the '+' terminal and the '−' terminal of amplifiers amp1 and amp2 is substantially zero. Therefore, the quiescent current is determined by I12 and the ratio between the areas of diode D2 and D12.

Figure 7:
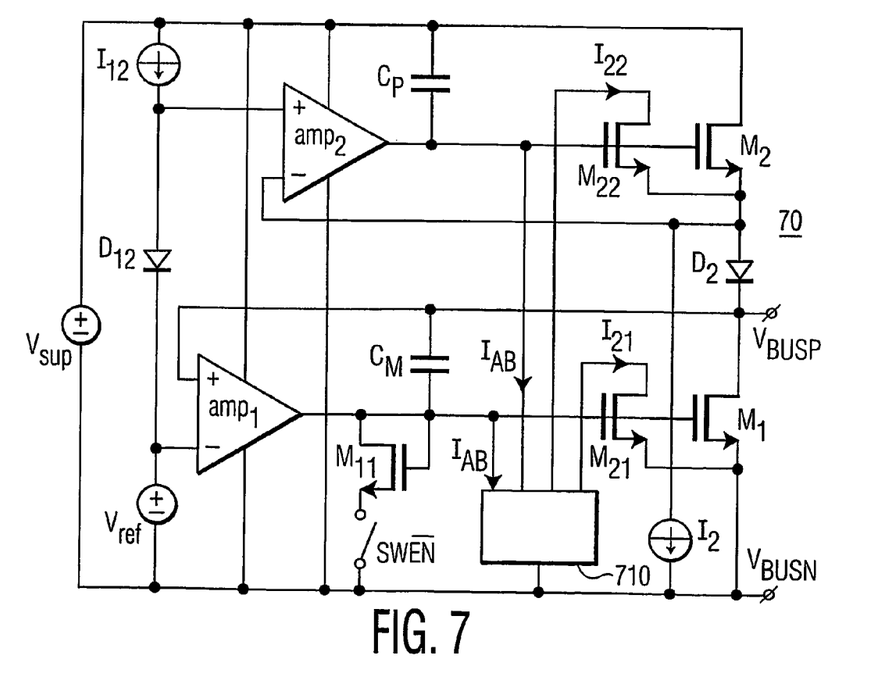
FIG. 7 illustrates an example controlled slew-rate class-AB driver/amplifier with transient control.

FIG. 7 illustrates an example controlled slew-rate class-AB driver/amplifier 70 with transient control. In the circuit 60 of FIG. 6, when the load draws more current than the quiescent current, the drain current of M1 is substantially zero, adversely affecting the dynamic behavior of the circuit 60. Also, if CMOS devices are used to implement amplifiers amp1 and amp2, the quiescent current in region three will not be well defined, because of the large offset of CMOS amplifiers.

In the driver 70, a current source I2 is added, in order to bias transistor M2 when the amplifier 70 is in the first and second regions of FIG. 1a, when diode D2 is blocking. Also, a class-AB control circuit is added, comprising control block 710 and transistors M21 and M22. Transistors M21 and M22 are configured to generate a copy I21, I22, of the bias currents of transistors M1 and M2, respectively. The class-AB control block 710 then selects the lower of the two bias currents and sets up a feedback loop by drawing in-phase currents $I_{AB}$ from the gates of both output transistors M1 and M2, so that the two bias currents stay above a minimum current that prevents M1 from switching off in the region between t2 and t3 of FIG. 1b.

Figure 8:
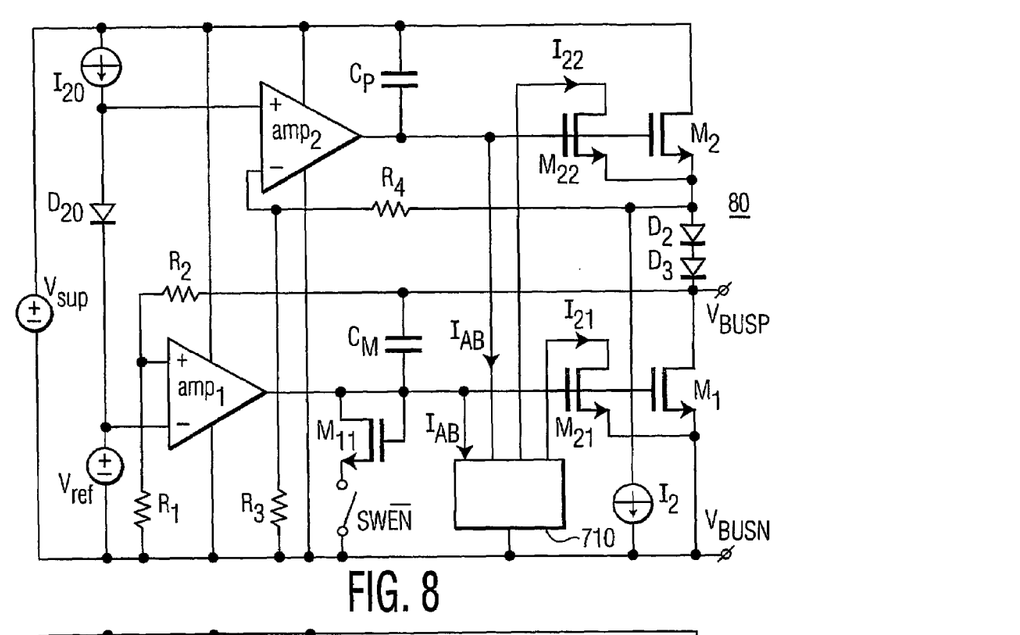
FIG. 8 illustrates an example controlled slew-rate class-AB driver/amplifier with gain.

FIG. 8 illustrates an example controlled slew-rate class-AB driver/amplifier 80 with gain. Resistors R1-R4 create the gain factor between the reference voltage Vref and the output voltage Vbusp generated in region three. The voltages created by the diodes need to be adapted according to the gain factor. For example, if the gain is two, two diodes D2 and D3 are needed as shown in FIG. 8. For higher gain factor more diodes are used. Another option is to replace diode D20 by a resistor and create current source I20 in such a way that the current is determined by a diode voltage and a resistor. In this way non-integer gain factors can be created.

Figure 9:
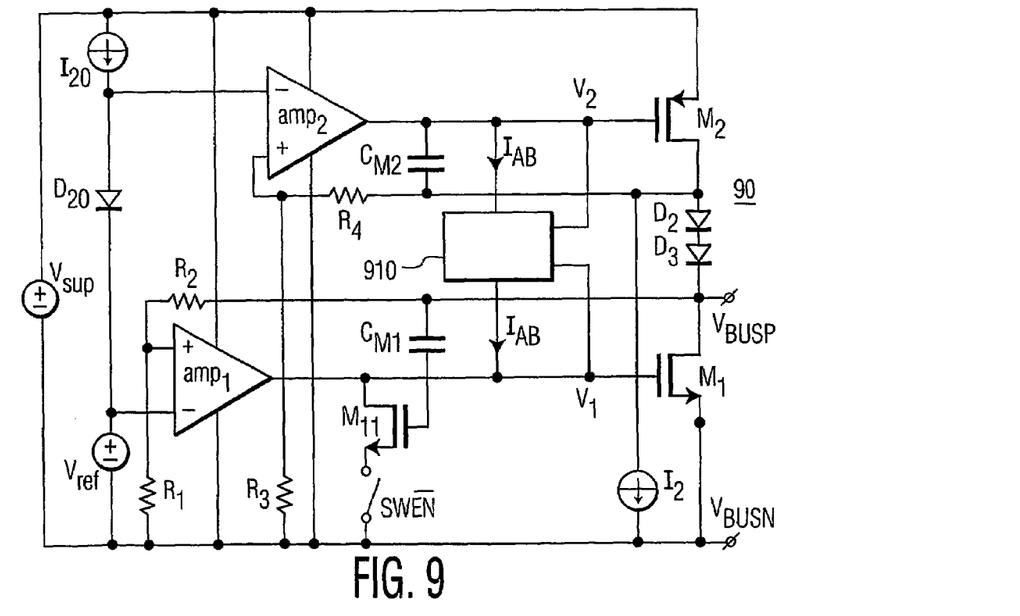
FIG. 9 illustrates an example controlled slew-rate class-AB driver/amplifier with rail-to-rail operation.

FIG. 9 illustrates an example controlled slew-rate class-AB driver/amplifier 90 with rail-to-rail operation. Rail-to-rail output voltage range is achieved by replacing the N-type transistor M2 of FIG. 8 with a P-type transistor, and modifying the circuit to accommodate the inverted type. Because transistor M2 of FIG. 9 is now employed as an inverting stage, the inputs of amplifier amp2 are swapped in order to maintain negative feedback in the upper feedback loop. Also, the connections of the class-AB control block 910 are changed to provide out-of-phase currents $I_{AB}$ to the gates of M1 and M2 to maintain negative feedback in the class-AB control loop. In FIG. 9, the voltages at the gates of M1 and M2 are illustrated as being directly as inputs to the class-AB control block 910, which is in principle similar to using the currents of M21 and M22 in the previously discussed circuits 70 and 80.

FIGS. 10-15 provide example circuit diagrams that embody the principles presented above.

Figure 10:
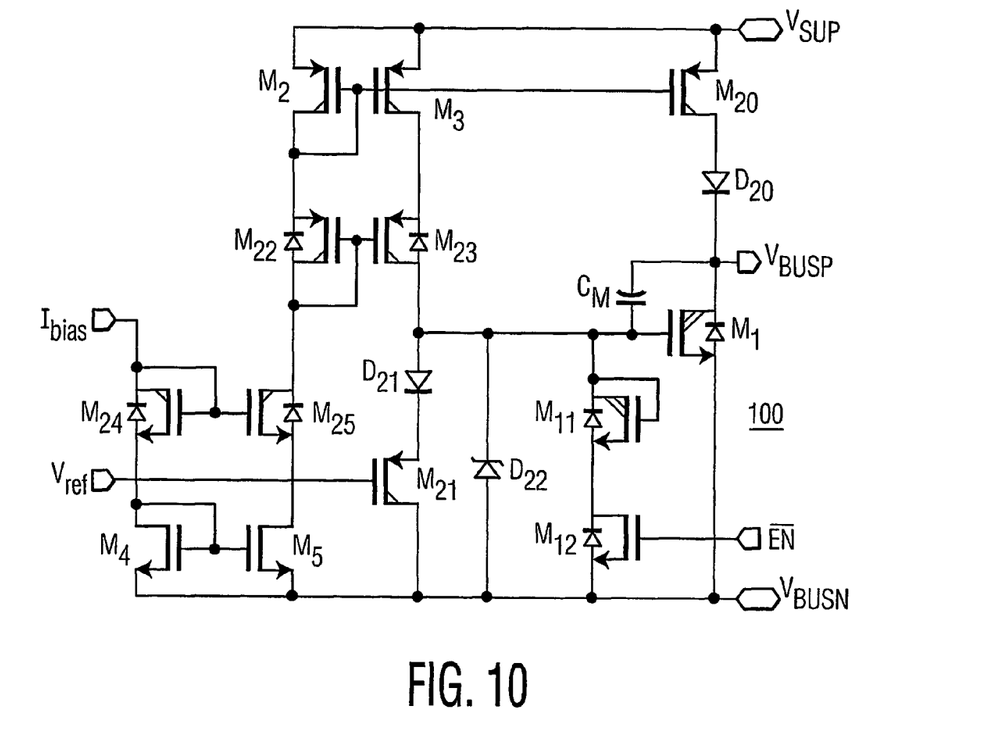
FIG. 10 illustrates an example circuit diagram of a controlled slew-rate driver/amplifier.

FIG. 10 illustrates an example circuit diagram of a controlled slew-rate driver/amplifier 100 based on the principles discussed with regard to FIG. 4. The bus driver 100 comprises output transistor M1 with Miller capacitor CM, transistor M11 that forms a switchable current mirror with transistor M1, and a transistor M12 that forms the switch. Bias current Ibias is mirrored by current mirrors M4,M5; M2,M3; and M2,M20. Transistor M20, connected to the drain of M1 via blocking diode D20, delivers current to the load, and also delivers the quiescent current of M1, so that no current is drawn from the bus when the bus driver 100 is disabled. The current mirrors M4-M5 and M2-M3 are cascoded using transistors M24, M25 and M22, M23, respectively. Transistor M21 and diode D21 implement a voltage clamp that limits the voltage at the gate of M1 in order to protect the gate-oxide of M1. The clamping voltage is set using input Vref. A secondary clamp created by zener diode D22 also limits the gate voltage of M1, in the event that the clamping circuit is too slow or the clamping voltage is incorrect.

Figure 11:
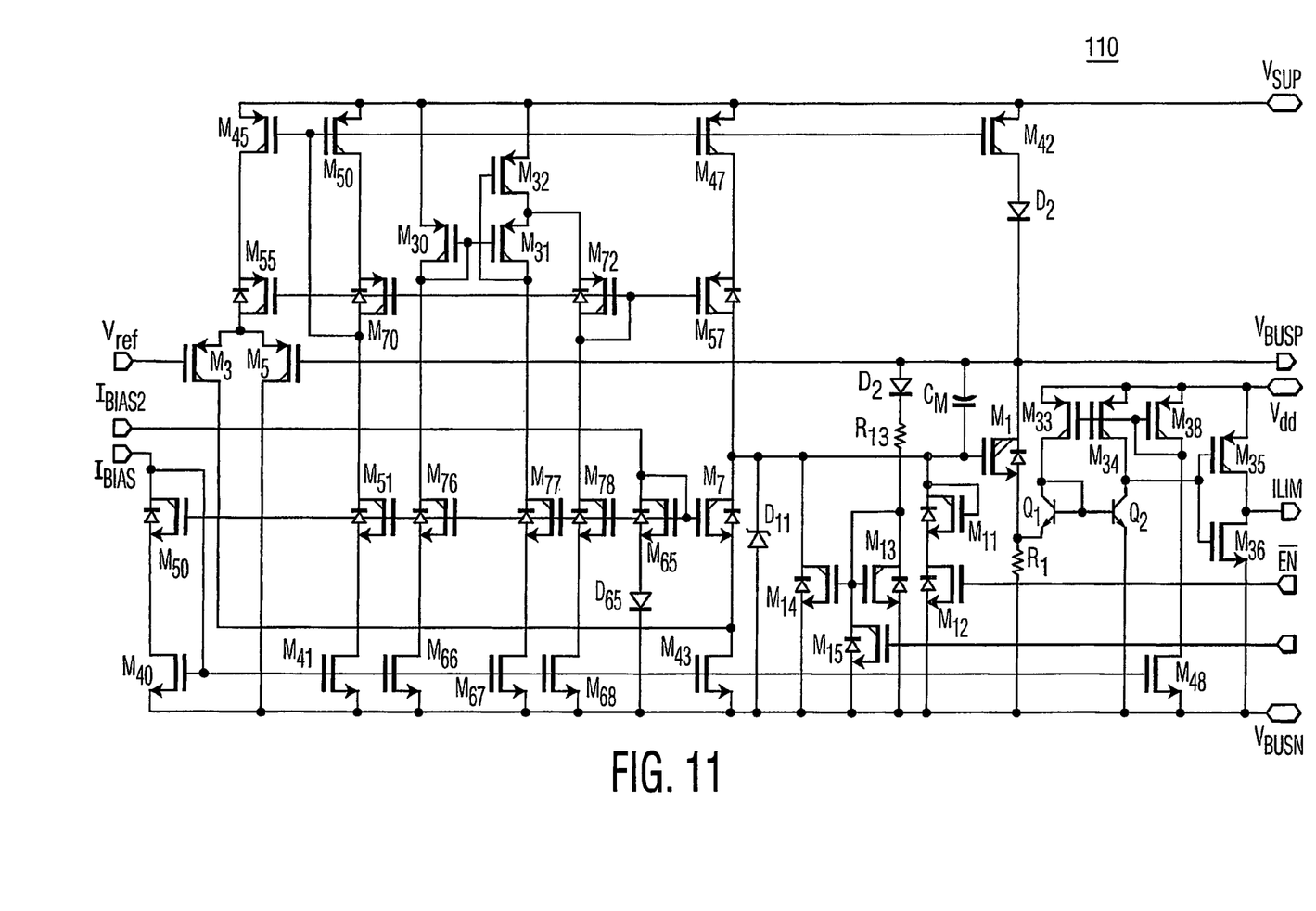
FIG. 11 illustrates an example circuit diagram of a controlled slew-rate driver/amplifier with fast turn-on time and controllable output voltage level.

FIG. 11 illustrates an example circuit diagram of a controlled slew-rate driver/amplifier 110 with controllable output voltage level, based on the principle presented in FIG. 5.

The amplifier amp1 of FIG. 5 is implemented in the driver 110 by differential stage M3, M5 and folded cascode M7 and drives output transistor M1 in such a way that the output voltage slews down until the output voltage Vbusp is equal to the reference voltage Vref. The maximum current flowing into the gate of the output transistor M1 is set by a current source created by transistor M7 and cascode M57 which determines the slew rate together with the Miller capacitor CM.

When the output level determined by input voltage Vref is reached, the bias current of M1 is controlled by current source M42. The driver is selectively disabled using transistor M11 and switch M12. Blocking diode D2 allows the bus voltage Vbusp to be higher than the supply voltage Vsup of the bus driver 110.

Transistors M30-M32 comprise a circuit that generates a voltage proportional to the saturation voltage of the P-type current sources. By using different bias currents created by transistors M66 and M67 with cascodes M76 and M77, and by using different width for devices M30 and M31, a voltage drop ΔV is generated across the source of M30 and the source of M31 given by $$\Delta V = \left(\sqrt{n} - \frac{1}{\sqrt{m}}\right)\sqrt{\frac{I_{67}L}{\mu C_{ox} W_{30}}} \quad (2)$$

where µ is the mobility of the charge carriers of the MOS transistors, Cox is the normalized oxide capacitance of the MOS transistors, L is the length of the MOS transistors, I67 is the current generated by transistor M67, W30 is the width of transistor M30, n is the ratio between the width of M31 and the width of M30 and m is the ratio between the current created by M68 and the current created by M67. Because the saturation voltage of the current sources can be written as $$V_{dsat} = \sqrt{p}\sqrt{\frac{I_{67}L}{\mu C_{ox} W_{30}}} \quad (3)$$

where the factor p depends on the current densities of the current sources, the voltage drop across the source of M30 and the source of M31 is proportional to the saturation voltage of the P-type transistors.

Transistor M32 sets up a feedback loop to ensure that the drain current of M31 is equal to the current created by current source M67 independent of the current flowing through M72. Transistor M72 is biased by current source M68 with cascode M78 and is used to create a level shift that is equal to the gate-source voltage of the cascodes. This level shift is added to the voltage at the source of M31. In this way the bias voltage for the cascodes M57, M58, M54, M55, M70 and M71 is created. Thereby, by selecting the proper current densities in transistors M30 and M31 and the current sources M45, M47, and M60, the current sources are always biased in saturation independent of process variations and temperature. This biasing could also be achieved by connecting the source of M72 to the positive supply connection Vsup and applying an appropriate scaling between the current density of M72 and the current density of the cascode transistors. However, in this case the cascode transistors are DMOS transistors with different behavior than the PMOS current sources. Therefore the resulting voltage across the current sources would not be related to the saturation voltage of the current sources.

The N-type cascodes M50, M51, M76-78, M7 are biased using transistor M65 and diode D65 biased by separate input current Ibias 2. The simple diode-configured M65 used to bias the N-type cascodes does not yield a voltage related to the saturation voltage of the N-type current sources. Forcing the source of M7 to be related to the saturation voltage of M43 would not leave sufficient room to bias M7 inside the gate-source voltage of M1 at high temperatures. Using diode D65 more head room is created at high temperatures, but the current sources may be operating in the linear region. The bias currents of the amplifier are created using input current Ibias and transistors M40-M43, M45, M47, M60 with cascodes M50, M51, M55, M57, M70. Zener diode D11 protects the gate-oxide of output transistor M1.

Additional circuits are added for using this amplifier as a secondary amplifier, as follows. A first circuit consisting of diode D13, resistors R13 and transistors M13-M15 makes sure that transistor M1 is not accidentally turned on when the supply voltage of the amplifier is too low. When the supply voltage is too low, the feedback loop set up by differential stage M3, M5 does not work and transistor M1 is not properly controlled. In that case transients on the bus can switch the gate of M1 on via Miller capacitor CM. To prevent M1 from switching on, the current flowing through diode D13 resistor R13 and current mirror M13, M14 keeps the voltage at the gate of M1 low. Another additional circuit comprising resistor R1, transistors Q1, Q2 and transistors M33-M36 detects the current flowing through transistor M1 in order to be able to turn off the transmitter when the bus voltage is pulled up. When the bus voltage is switched to the supply voltage, the current flowing through M1 is increasing. Consequently, the voltage across R1 increases and therefore also the voltage at the base of Q2, which is driven via Q1, increases. As a result, the collector current of Q2 increases and, when the collector current of Q2 is larger than the current created by current source M34, the input voltage of inverter M35, M36 is pulled low, so that the output ILIM becomes high. The signal ILIM is used to disable the transmitter so that the bus voltage can rise without wasting current.

Figure 12:
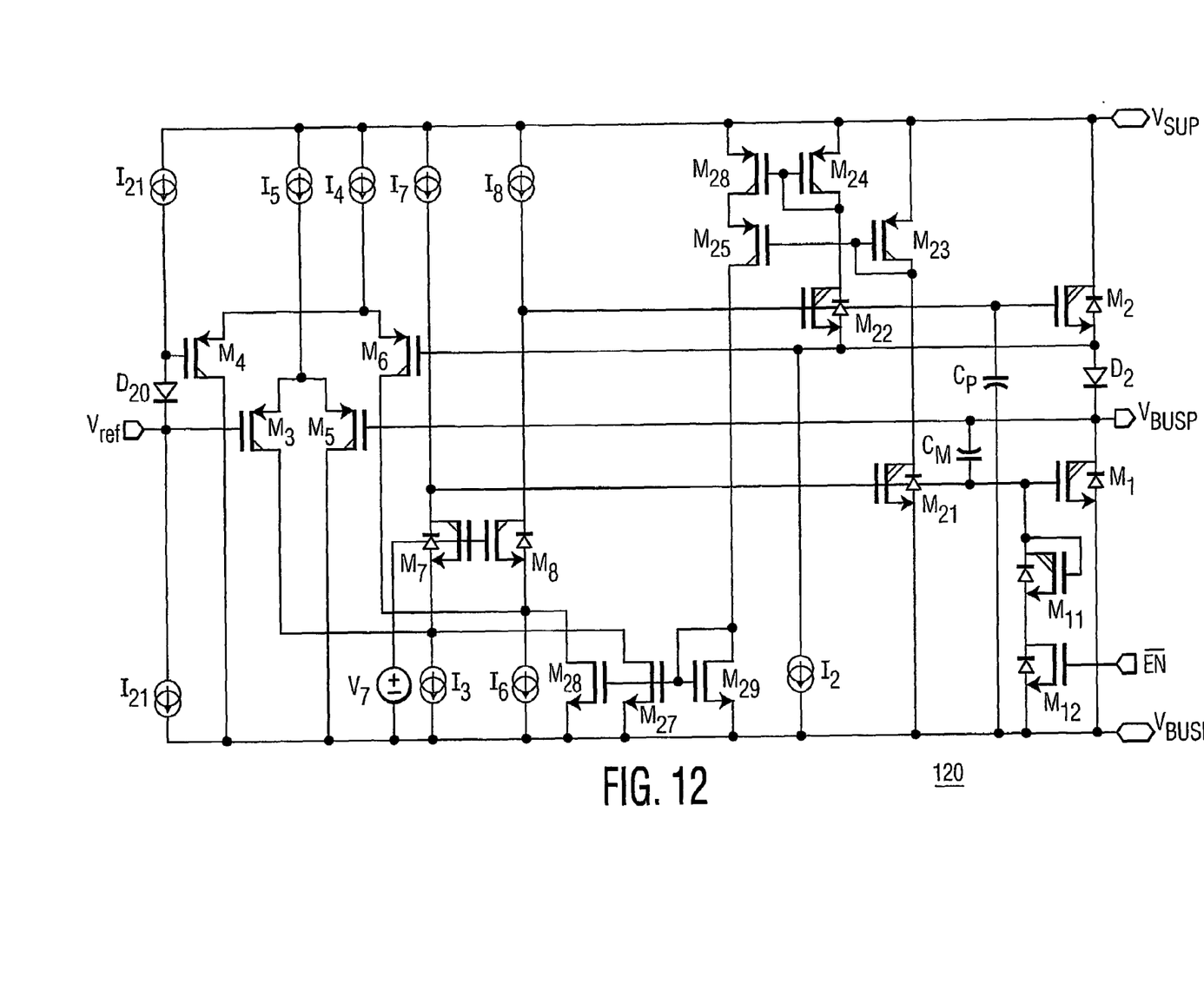
FIG. 12 illustrates an example circuit diagram of a controlled slew-rate class-AB driver/amplifier with fast turn-on time, controllable output voltage level, and transient control.

FIG. 12 illustrates an example circuit diagram of a controlled slew-rate class-AB driver/amplifier 120 with fast turn-on time, controllable output voltage level, and transient control. The bus driver 120 is based on the principle presented in FIG. 7. The first amplifier comprising differential stage M3, M5 and folded cascode M7 drives output transistor M1 in such a way that the output voltage is slewing down until the output voltage is equal to the reference voltage Vref. The maximum current flowing into the output stage is set by I7 and therefore the slew rate is determined by I7 and CM. The driver can be disabled using transistor M11 and switch M12. When the driver is disabled, all the current from I7 is flowing into transistor M11, so that the quiescent current of M1 is determined by I7 and the W/L ratios of M11 and M1. The second amplifier consists of differential stage M4, M6 and folded cascode M8. Frequency compensation of the second amplifier is obtained using CP. Capacitor CP is connected to ground yielding improved power supply rejection compared to the circuit shown in FIG. 7, where CP is connected to the supply and signals on the supply can influence the gate of M1.

When the output stage is disabled, the second amplifier drives output transistor M2 using diode D20 in such a way that the voltage at the source of M2 is prebiased at the correct voltage for driving the bus level set by Vref. In this case the output voltage is high, diode D2 is blocking and the quiescent current of M2 is controlled by I2.

When the bus driver is enabled and the bus level is reached, the second amplifier M4, M6, M8 drives transistor M2 in such a way that M2 delivers the current drawn by the bus load. In this situation, the quiescent current of the output stage is controlled by a class-AB control circuit comprising transistors M21-M29. Transistors M21 and M22 generate a copy of the bias current of output transistors M1 and M2, respectively. The drain currents of M1 and M2 are then mirrored and combined by a minimum selector circuit M23-M26. The output of the minimum selector circuit at the drain of M25 is controlled by the lower of the two input currents flowing into diode-connected transistors M23 and M24. The lower of the two bias currents is then mirrored by M27-M29. The two equal currents created by M27 and M28 then drive the gates of the output transistors in phase via cascodes M7 and M8. Thus, a feedback loop is formed that controls the minimum current of the output stage so that the output transistors never switch off completely. When, for example, M2 is delivering a high current to the bus load, the current flowing through M22 and M24 is also high. Therefore, transistor M26 is driven hard and the voltage across the drain-source terminals of M26 is low. Then, transistors M23 and M25 are operating as a current mirror so that the drain current of M21, which is a copy of the drain current of M1, is controlling the feedback loop. Thus, the bias current of M1 is regulated at a constant current.

Figure 13:
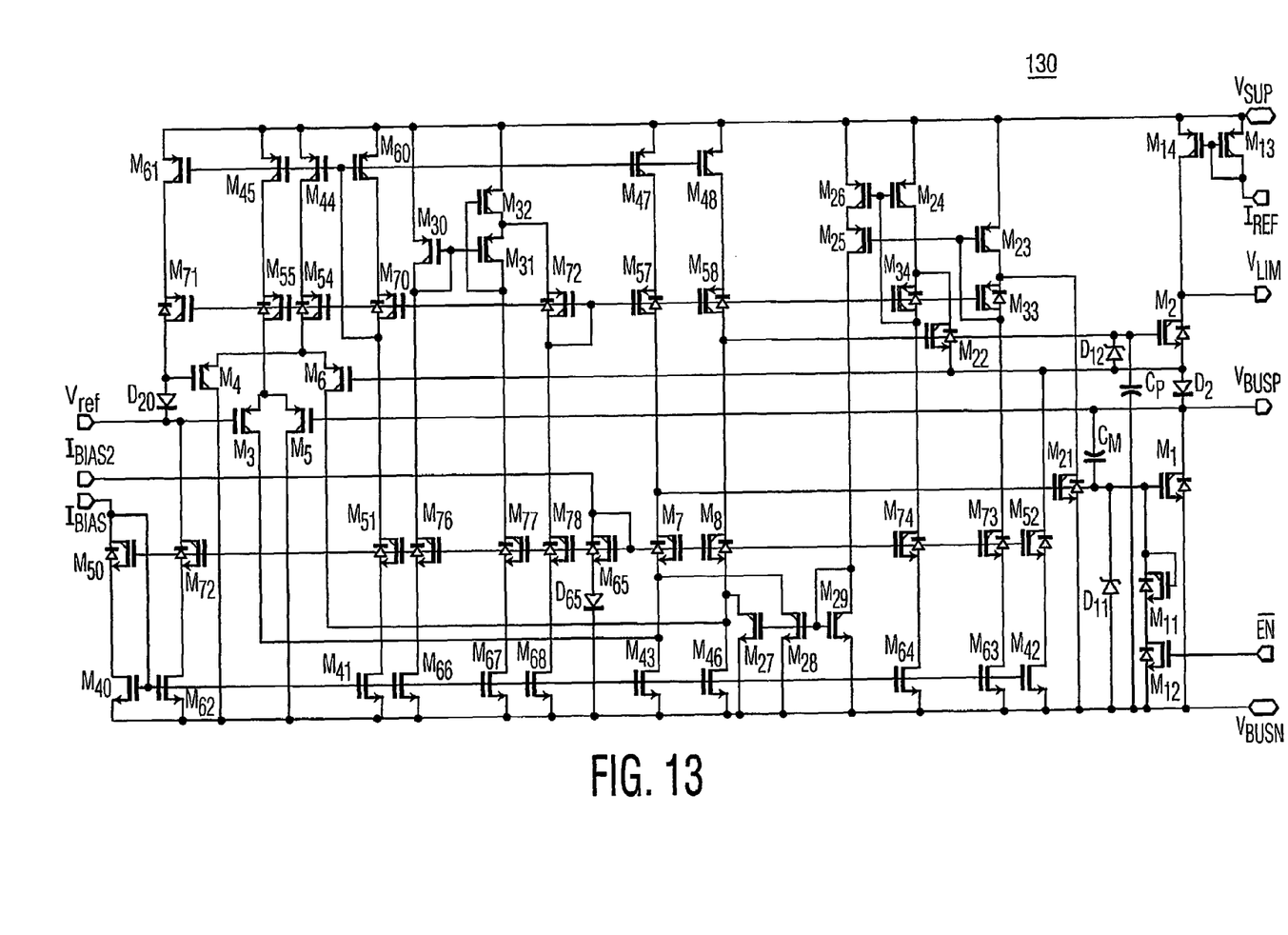
FIG. 13 illustrates a more detailed example circuit diagram of a controlled slew-rate class-AB driver/amplifier.

FIG. 13 illustrates a more detailed example circuit diagram of a controlled slew-rate class-AB driver/amplifier 130, based on the principles presented in FIG. 12. This circuit 130 comprises the output stage M1, M2 with disable circuit M11, M12, blocking diode D2, compensation capacitors CM, CP and driving amplifiers M3, M5, M7 and M4, M6, M8. The current sources of the driver 130 are implemented using transistors M40-M48 and M60-M62 with cascodes M50-M58 and M70-M72. The class-AB control circuit consists of transistors M21-M29 and M33, M34. Folded cascodes M33, M34 biased by current sources M63, M64 and cascodes M73, M74 are added to create more head room for transistor M22. Current mirror M13-M14 implements a current limit so that the maximum current that M2 can deliver is determined by Iref and the W/L rations of M13 and M14. Thereby, certain devices on the bus can override the bus level driven by the bus driver as required.

The source of M24 would conventionally be connected to the positive supply VSUP. However, in the driver 130, the source of M24 is connected to VLIM at the drain of M14. In normal operation the voltage at VLIM is almost the same as the voltage at VSUP. However, when M2 is limited by the current limit, the voltage at VLIM drops. By connecting the source of M24 to VLIM, the influence of the current of M2 on the class-AB biasing is further reduced, so that the lower current of M1 is controlling the class-AB biasing more strongly. Transistors M30-M32 and M72 create the bias for the P-type cascodes. The N-type cascodes are biased using transistor M65 and diode D65 as discussed above. Zener diodes D11 and D12 protect the gate-oxide of output transistors M1 and M2.

Figure 14:
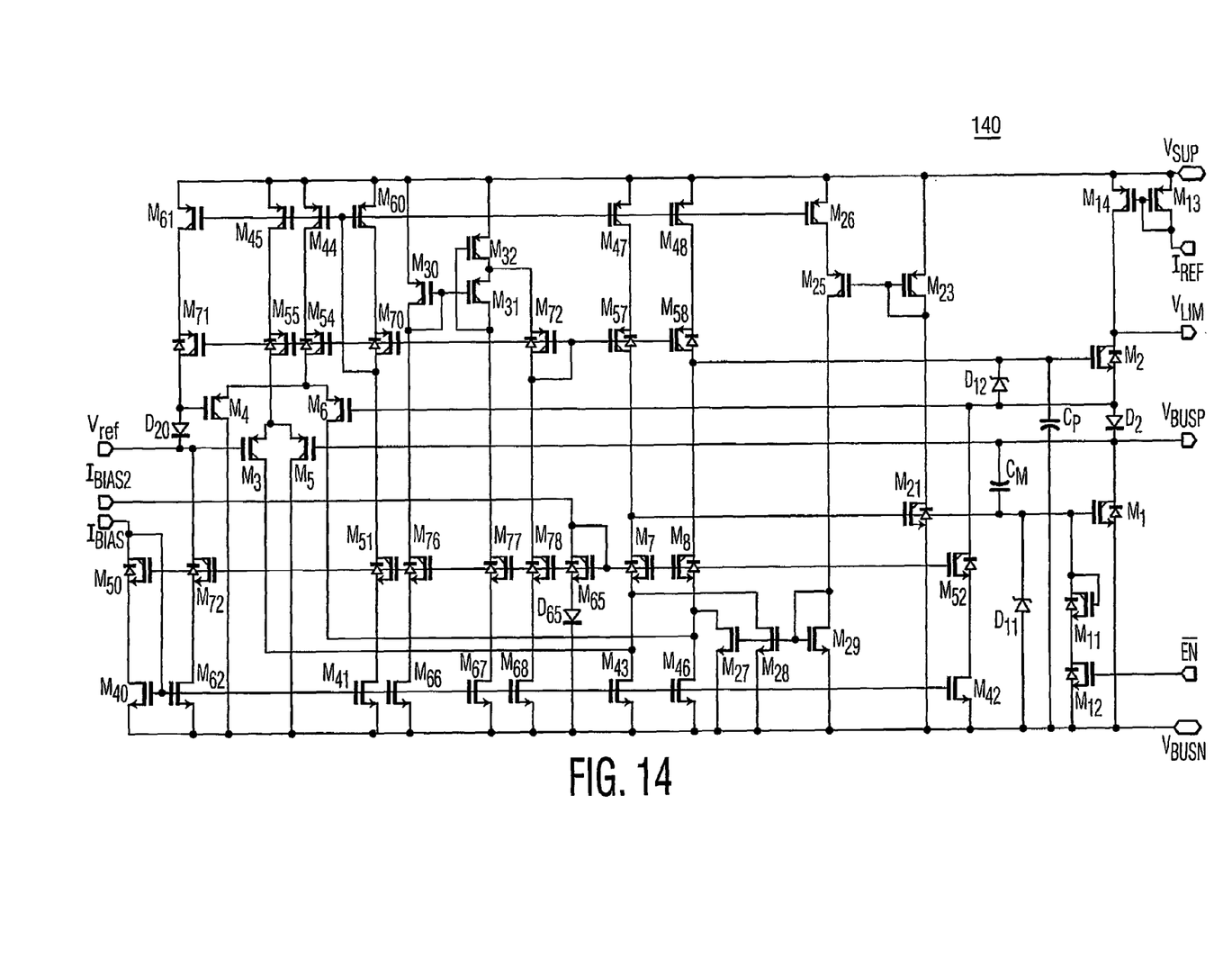
FIG. 14 illustrates an example circuit diagram of a controlled slew-rate class-AB driver/amplifier with simplified transient control.

Since devices on the bus are not allowed or not capable of pulling the bus voltage up, transistor M2 is always biased, even without a class-AB control circuit. Therefore, the class-AB control circuit only needs to control the minimum current of M1 and the circuit can be simplified. The resulting circuit 140 is depicted in FIG. 14. Apart from the class-AB control circuit, the circuit 140 is identical to the circuit 130 shown in FIG. 13. The class-AB control circuit now only consists of transistors M21, M23, M25-M29. When the drain current of M1 is high, the drain current of M21 and M23 is also high. Therefore, the gate-source voltage of M23 is high and transistor M25 functions as a cascoded for current source M26. Thus, the constant current created by M26 is mirrored by M27-M29 and the class-AB control loop is not active. When the drain current of M1 is low, the drain current of M21 and M23 is also low so that the gate-source voltage of M23 is low. Thus, transistor M25 forces transistor M26 in the linear region. Changes in the drain current of M1 result in changes in the source voltage of M25 and, because M26 is operating in the linear region, the current flowing into current mirror M27-M29 changes. Thus, the class-AB control loop is active and controls the bias current of M1.

Figure 15:
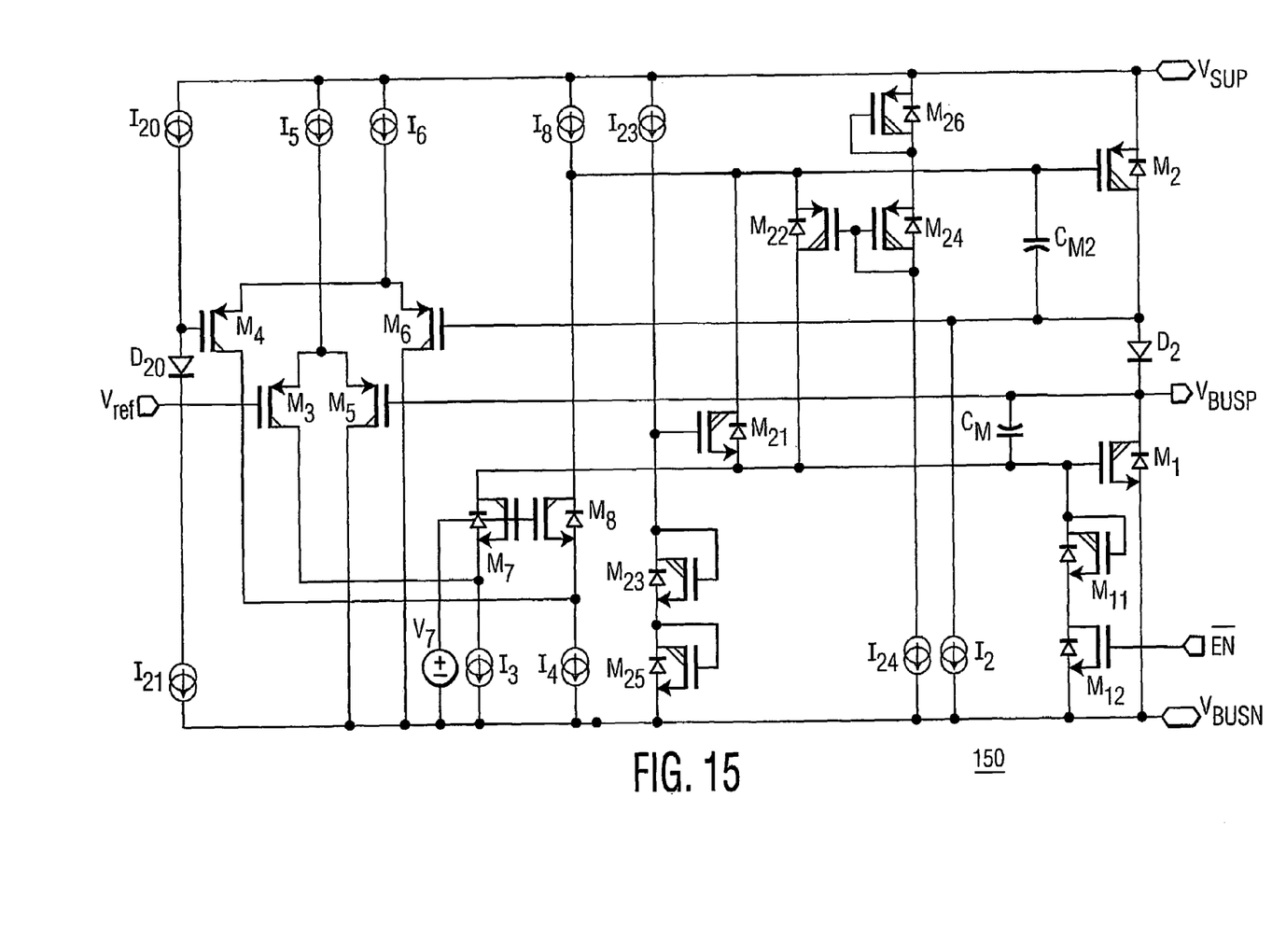
FIG. 15 illustrates an example circuit diagram of a controlled slew-rate class-AB driver/amplifier with rail-to-rail operation.

FIG. 15 illustrates an example circuit diagram of a controlled slew-rate class-AB driver/amplifier 150 with rail-to-rail operation. The bus driver 150 is based on the principle presented in FIG. 9. The first amplifier comprising differential stage M3, M5 and folded cascode M7 drives output transistor M1 in such a way that the output voltage is slewing down until the output voltage is equal to the reference voltage Vref. The maximum current flowing into the output stage is set by I8 minus the drain current of M8; thus, the slew rate is determined by I8 minus the drain current of M8 and CM1. The driver 150 can be disabled using transistor M11 and switch M12. When the driver 150 is disabled, the current from I8 minus the drain current of M8 is flowing into transistor M11, so that the quiescent current of M1 is determined by I8 minus the drain current of M8 and the W/L ratios of M11 and M1. The second amplifier consists of differential stage M4, M6 and folded cascode M8. Frequency compensation of the second amplifier is obtained using CM2.

When the output stage is disabled, the second amplifier drives output transistor M2 using diode D20 in such a way that the voltage at the source of M2 is prebiased at the correct voltage for driving the bus level set by Vref. In that case the output voltage is high, diode D2 is blocking and the quiescent current of M2 is controlled by I2.

When the bus driver is enabled and the bus level is reached, the second amplifier M4, M6, M8 drives transistor M2 so that M2 delivers the current drawn by the bus load. In this situation, the quiescent current of the output stage is controlled by a class-AB control circuit comprising transistors M21-M26. The bias current of output transistors M1 and M2 is strongly controlled by two translinear loops M25, M23, M21, M1 and M26, M24, M22, M2, respectively. When, for example, M2 is delivering a high current to the bus load, the gate-source voltage of M2 is high and transistor M22 is switched of. Therefore, all the bias current of the class-AB control circuit, I8 minus the drain current of M8, is flowing through M21. Consequently, the gate-source voltage of M21 increases and the gate-source voltage of M1 decreases. However, since the current flowing through M21 is still limited, the gate-source voltage of M1 does not collapse and a minimum bias current in M1 is maintained.

The foregoing merely illustrates the principles of the invention. It will thus be appreciated that those skilled in the art will be able to devise various arrangements which, although not explicitly described or shown herein, embody the principles of the invention and are thus within the spirit and scope of the following claims.

What is claimed is:

1. A driver comprising:
   a first current source;
   an output transistor, operably coupled to the first current source;
   a mirror transistor, wherein the first current source includes a first amplifier that is configured to: compare an output voltage of the output transistor to a reference voltage, and, provide a driving current to the output transistor when the output voltage of the output transistor is above the reference voltage; and
   a switch that is configured to selectively couple the mirror transistor and the output transistor to form a first current mirror that controls bias current through the output transistor.

2. The driver of claim 1, wherein the driving current is substantially constant.

3. The driver of claim 1, further including a second current source that is configured to provide load current to a load that is coupled to the output transistor.

4. The driver of claim 3, wherein the second current source includes a second amplifier that is configured to provide the load current to the load when the output voltage is substantially equal to the reference voltage.

5. The driver of claim 4, further including a controller that is configured to maintain a minimal current to the output transistor that prevents the output transistor from turning off.

6. The driver of claim 3, wherein the second current source is further configured to provide the bias current to the output transistor.

7. The driver of claim 6, further including a compensation circuit that is configured to control the bias current substantially independent of process variations and temperature.

8. The driver of claim 3, wherein the second current source includes a blocking diode that isolates the driver from voltages applied to the output transistor from sources external to the driver.

9. The driver of claim 3, wherein the output transistor is of a first channel-type, and the second current source includes a transistor of a second channel-type that differs from the first channel-type.

10. The driver of claim 1, wherein the first amplifier is configured to provide configurable gain.

11. The driver of claim 1, wherein the first current source includes a second current mirror, that provides the bias current to an input of the first current mirror, and a third current mirror that provides the bias current to an output of the first current mirror.

12. The driver of claim 1, wherein the minor transistor and the output transistor are sized so that the bias current provides a gate-source voltage that is above a threshold voltage of the output transistor.

13. The driver of claim 1, wherein the output transistor is configured to have a Miller capacitor coupled between a drain of the output transistor and a gate of the output transistor.

14. A driver comprising:
   a first current source;
   an output transistor having a gate operably coupled to the first current source, a drain operably coupled to a first node of a bus, and a source operably coupled to a second node of a bus, wherein the first current source includes a first differential amplifier having: a first input operably coupled to the first node of the bus, a second input operably coupled to a reference voltage, and an output coupled to the gate of the output transistor;
   a mirror transistor having a gate operably coupled to the gate of the output transistor, a drain operably coupled to the gate of the output transistor, and a source;
   a switch operably coupled between the source of the minor transistor and the second node of the bus; and
   a Miller capacitor coupled between the drain of the output transistor and the gate of the output transistor.

15. A method of providing a drive current to a bus, comprising:
   providing a first current to a gate of an output transistor during an inactive state, and providing a second current to the output transistor in an active state, and providing a third current to the output transistor when a voltage on the bus reaches a determined voltage, wherein the first current maintains a non-zero voltage at the gate of the output transistor.

* * * * *